United States Patent [19]
Monti

[11] Patent Number: 5,557,236
[45] Date of Patent: Sep. 17, 1996

[54] INTEGRATED CIRCUIT WITH BIDIRECTIONAL PIN

[75] Inventor: Marco Monti, Milan, Italy

[73] Assignee: SGS-Thomson Microelectronics S.r.l., Agrate Brianza, Italy

[21] Appl. No.: 308,708

[22] Filed: Sep. 19, 1994

[30] Foreign Application Priority Data

Oct. 29, 1993 [EP] European Pat. Off. .............. 93830437

[51] Int. Cl.⁶ ................................................. H01L 25/00
[52] U.S. Cl. .............................................. 327/565; 327/564
[58] Field of Search .................................. 327/564, 565, 327/566, 334, 403, 407, 415; 326/101

[56] References Cited

U.S. PATENT DOCUMENTS

| | | | |
|---|---|---|---|
| 4,350,906 | 9/1982 | Gillberg | 307/469 |
| 4,752,700 | 6/1988 | Boyacigiller | 307/297 |
| 4,797,569 | 1/1989 | Boyacigiller | 307/297 |
| 4,835,414 | 5/1989 | Freidin | 327/565 |
| 5,121,036 | 6/1992 | Fuji | 327/565 |

FOREIGN PATENT DOCUMENTS

2925331  1/1980  Germany ........................ H03K 19/00

OTHER PUBLICATIONS

Patent Abstracts of Japan, vol. 7, No. 148 (Jun. 29, 1983), Patent No. 58–060825.

*Primary Examiner*—Toan Tran
*Attorney, Agent, or Firm*—David M. Driscoll; James H. Morris

[57] ABSTRACT

An integrated circuit has at least one input terminal and at least one output terminal, respectively, for receiving and transmitting digital and/or analog signals, being associated with discrete circuit portions of the integrated circuit which implement different logic functions. Advantageously, such terminals are coincident with a single pin, and an electronic circuit is arranged within the integrated circuit to detect the logic state of the pin.

27 Claims, 4 Drawing Sheets

INTEGRATED CIRCUIT WITH BIDIRECTIONAL PIN

BACKGROUND OF THE INVENTION

1. Field of the Invention

This invention relates to a semiconductor integrated circuit incorporating a bidirectional pin.

2. Discussion of the Related Art

As is well known, external connection pins provide the terminations for a package containing an electronic semiconductor integrated circuit. They allow the package to be mounted in a quick-connect fashion on a carrier board while electric connections are made.

It is desirable in this field for the number of the external pins be minimized, both to bring down the package manufacturing costs, and to enhance the efficiency and reliability of the incorporated electronic device.

This desire clashes with the requirements of the integrated circuit designer who is called upon to consolidate and implement a number of logic functions the circuit, but has a limited number of pins for externally coupling the circuit. Another problem for the designer is that the circuit must meet the requirements of the manufacturer's packaging line. It can thus be appreciated that the current trend toward a decreased number of external pins adds to the designer's work.

For these reasons, the designer is seldom afforded a sufficient number of external pins to provide for all the functions that he or she may desire. Often the designer must accept limitations on the circuit performance and/or the potential for interfacing with external circuits.

Understandably, it would be desirable if a single pin could serve multiple functions. This has not been feasible because disturbance or interaction might occur between functions.

For example, consider FIG. 1, which shows an integrated circuit having a first digital output pin A where a voltage value may be present which corresponds to either a logic low (0–2.5 volts) or a logic high (3.5–5 volts). A second pin B is desired for digital or control input, and its state may either be, for example, an open circuit or of grounded connection. It is apparent that if pins A and B coincided, a control signal received on pin B would interfere with the proper operation of the output at pin A.

It would be desirable to provide an improved integrated circuit which overcomes the limitations of prior approaches, and which allows a smaller number of external pins to be used.

SUMMARY OF THE INVENTION

An object of the invention is to provide an integrated circuit having at least one bidirectional pin, i.e., a pin adapted to operate in a dual mode—as an output terminal or as an input terminal.

A further object of this invention is to arrange for at least two discrete circuit functions to be provided at one pin having different digital or analog logic functionalities, and for the operability of one function to be unrelated to that of the other function.

According to the present invention, a single pin serves as a digital output and as a digital input, while an electronic circuit detects the logical state of the pin.

The pin is preferably coupled to ground through an external resistance and a switch. The circuit preferably includes/an actuator block coupled to the pin and to an internal resistance. The output of the actuator block is an input to one terminal of a comparator, the other terminal being coupled to a reference voltage.

BRIEF DESCRIPTION OF THE DRAWINGS

The features and advantages of a circuit according to the invention will be apparent from the following detailed description of an embodiment thereof, given by way of example and not of limitation with reference to the accompanying drawings in which.

DETAILED DESCRIPTION

Figure 1:
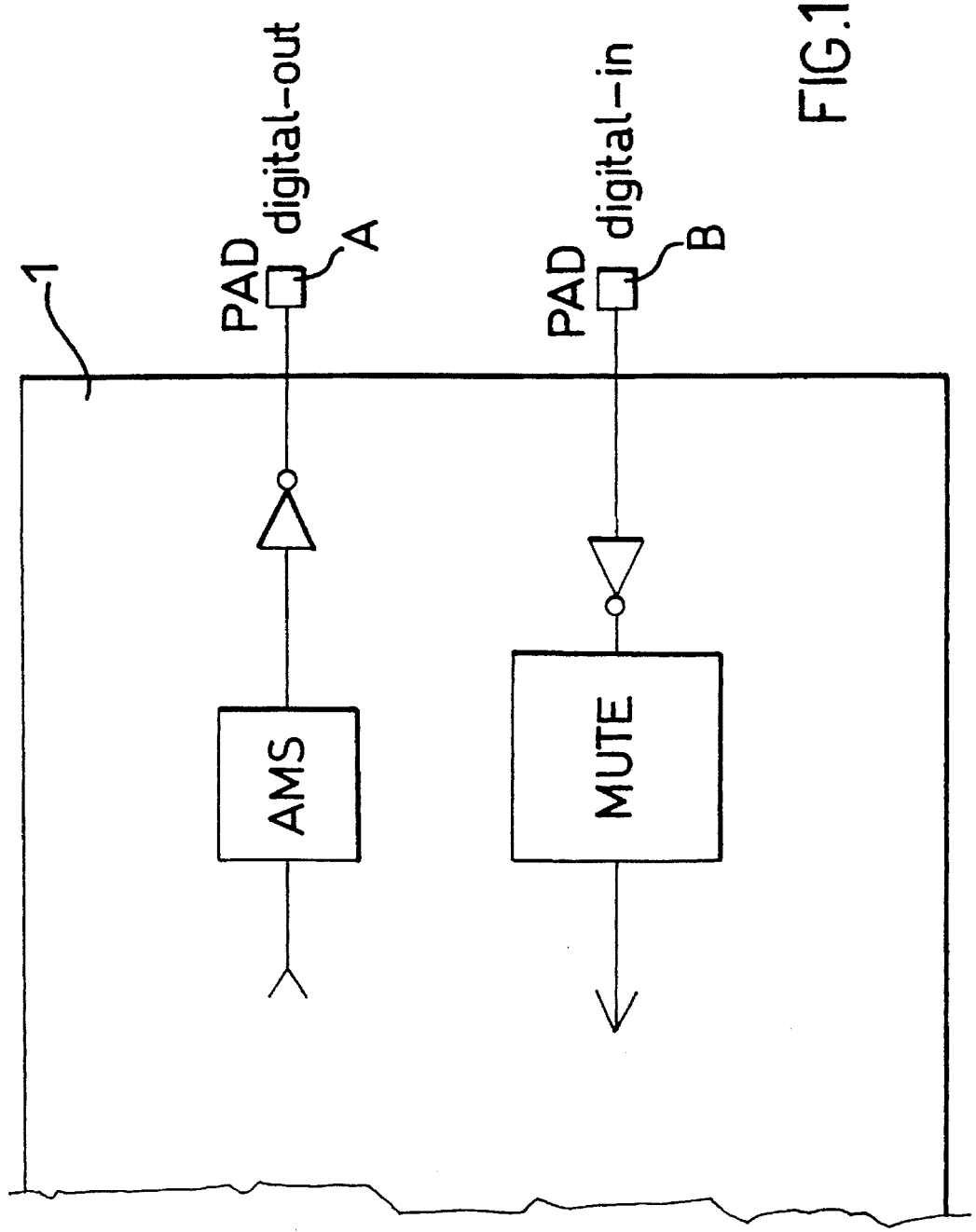
FIG. 1 is a schematic of a prior art integrated circuit.
Figure 2:
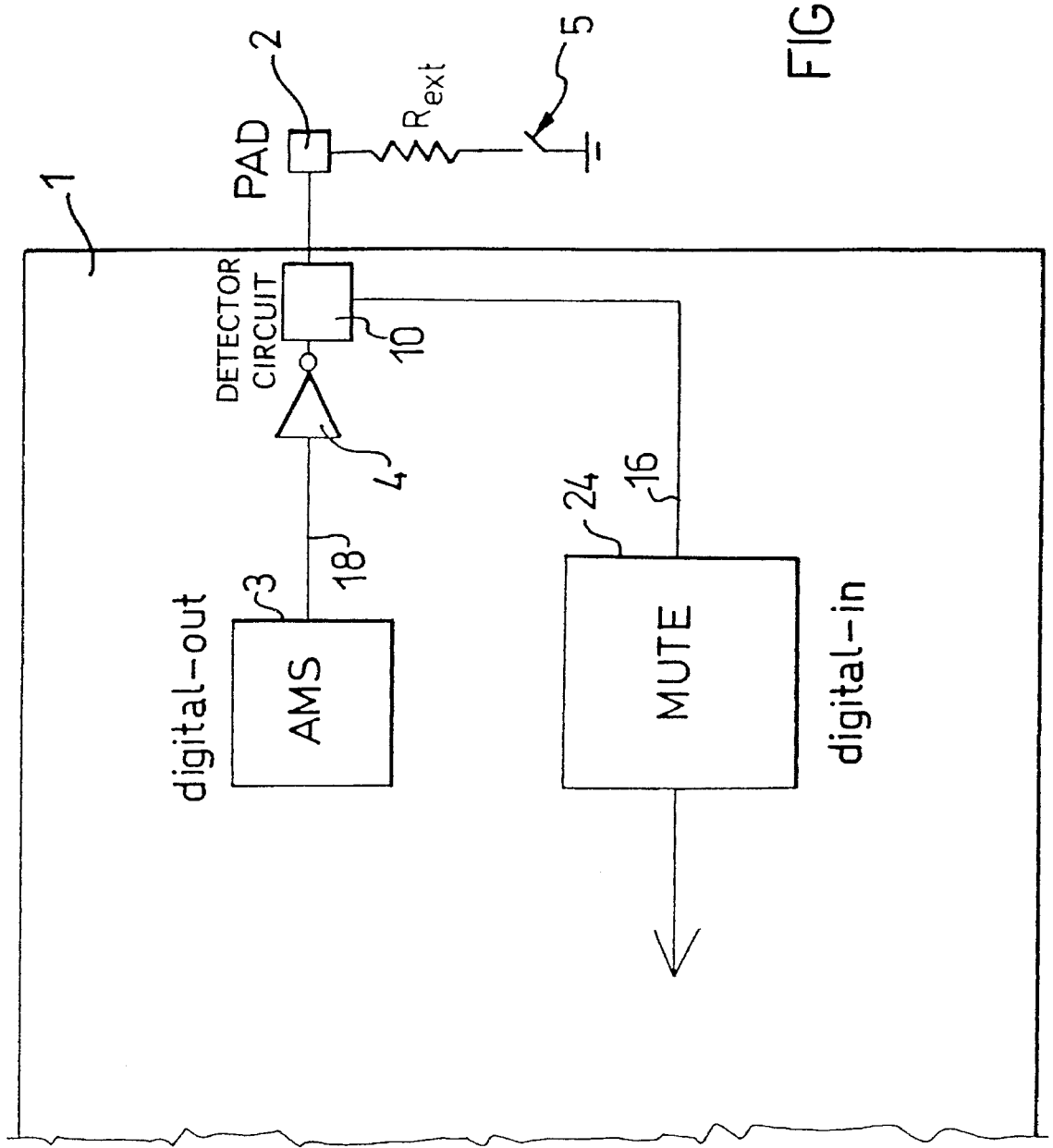
FIG. 2 is a schematic of an integrated circuit embodying this invention.

Referring to FIG. 2, a semiconductor integrated circuit 1 has a dual-function, bidirectional external pin 2 in accordance with the invention. Circuit 1 may be, for example, an audio device known by the trade name of TDA 7337, produced by the assignee of the present invention.

Pin 2 is connected, via an inverter 4, to an output terminal of a first circuit portion 3 marked AMS (Automatic Music Sensor). The output has typical CMOS threshold voltage levels, i.e., the voltage value supplied on that output is in the 0–5 volt range. Pin 2 is also connected to an input terminal of a second circuit portion 24 marked MUTE and is intended to activate and deactivate a "mute" function of audio circuit 1.

In accordance with the invention, the pin can be coupled to another circuit portion intended for implementing another function, e.g., to enable a "standby" function of the audio circuit.

Externally of circuit 1, pin 2 is connected to ground through resistance $R_{ext}$ whose value is known and is preferably about 40 kohms. In series between $R_{ext}$ and ground is a normally open microswitch 5 provided either by an external open-collector circuit or by a gate of a microprocessor.

The voltage level on pin 2 defines the logic state of the digital output. When switch 5 is closed by grounding external resistance $R_{ext}$, the voltage applied to pin 2 represents the logic state of a control input, and accordingly, provides the corresponding digital command to the digital input function.

Figure 3:
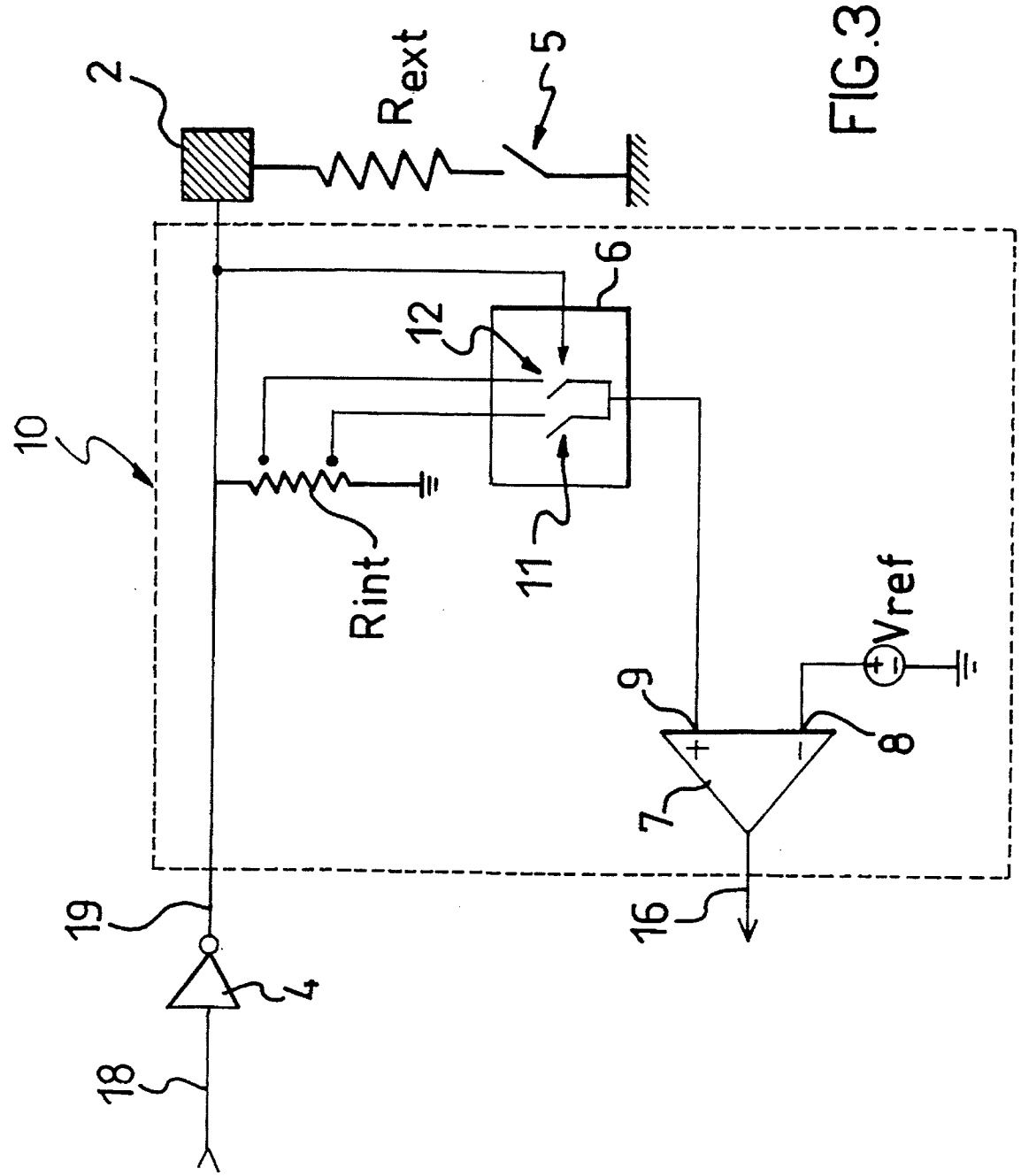
FIG. 3 is a schematic showing FIG. 2 in more detail.

Referring to FIG. 3, according to the invention, a circuit 10 is provided within circuit 1 to detect the logic state of pin 2 and to locate its operative functions as digital output or digital input. Circuit 10 has an actuator block 6 and a comparator 7 having a first inverting input 8 at which a reference voltage $V_{ref}$ is provided, and a second non-inverting input 9 connected to an output terminal of actuator block 6. Block 6 has at least one pair of normally open electronic switches 11, 12 which are tied operatively to the voltage value on pin 2, i.e., the voltage signal at pin 2 is picked up and transmitted to actuator block 6 to allow switches 11, 12 to be driven.

An internal impedance $R_{int}$ is connected between pin 2 and ground, and allows variations in the voltage value appearing on pin 2 to be detected. Switches 11, 12 parallel connect the opposing ends of the internal impedance $R_{int}$ to non-inverting input 9 of comparator 7. The comparator has an output terminal 16 for coupling to an input terminal of a circuit such as MUTE 24 (FIG. 2).

Circuit 10 is described in more detail with reference to the embodiment shown in FIG. 4. Internal resistance $R_{int}$ has a set of resistors R1, R2, and R3 connected in series between a signal ground and pin 2. Preferably, these resistors have values of 6, 30, and 6 kohms, respectively. The first resistor, R1, has one end connected to ground and another end connected to the drain terminal of a first field-effect transistor M1, preferably an MOS type, as well as to the resistor R2. Transistor M1 has a source terminal connected to non-inverting input 9 of the comparator 7 and to the source terminal of a second MOS transistor M2.

This second transistor M2 has a drain terminal connected between the resistors R2 and R3, and a gate terminal connected to the input of an inverter 13 whose output is connected to the gate terminal of transistor M1. Transistors, M1, M2 perform basically the same functions as the Two switches 11, 12 of FIG. 3.

Resistors R1, R2, and R3 are in a network 14 which also includes a fourth resistor R4 and a third MOS transistor M3. Resistor R4, preferably about 40 kohms, is connected between ground and the source of transistor M3 which has a drain terminal connected to pin 2.

The gate terminal of transistor M3 is connected to the gate terminal of a fourth transistor M4 which is further connected to transistor M3 by the coupling of the respective source and drain terminals. A biasing resistor R5 of about 120 kohms is connected between the drain and the source of fourth transistor M4. A current source A1 connects a positive 8-volt supply voltage $V_{dd}$ to the drain of the transistor M4.

The inverter 4 has an input terminal 18 coupled to an output terminal of a circuit such as AMS 3 (FIG. 2), and an output terminal 19 connected to the gate terminals of the transistors M3 and M4 and to the gate of the transistor M2.

By operating microswitch 5, a change is produced in internal impedance $R_{int}$ depending on whether external resistance $R_{ext}$ is connected or unconnected to ground.

The change in the internal impedance is detected by comparator 7 leased upon a current to voltage conversion. Thus, comparator 7 changes the logic state of its output and sends a control signal 16 to certain internal circuitry (not shown) of circuit 1. The change in internal impedance brings about a change in the voltage value present on pin 2. In particular, the voltage drops when the external resistance is grounded.

Understandably, it is necessary to arrange for this change to occur within a range of values consistent with the conditions for MOS technology circuit operation. However, the connection of the external resistance causes no change to occur in the logic state of output pin 2.

Figure 4:
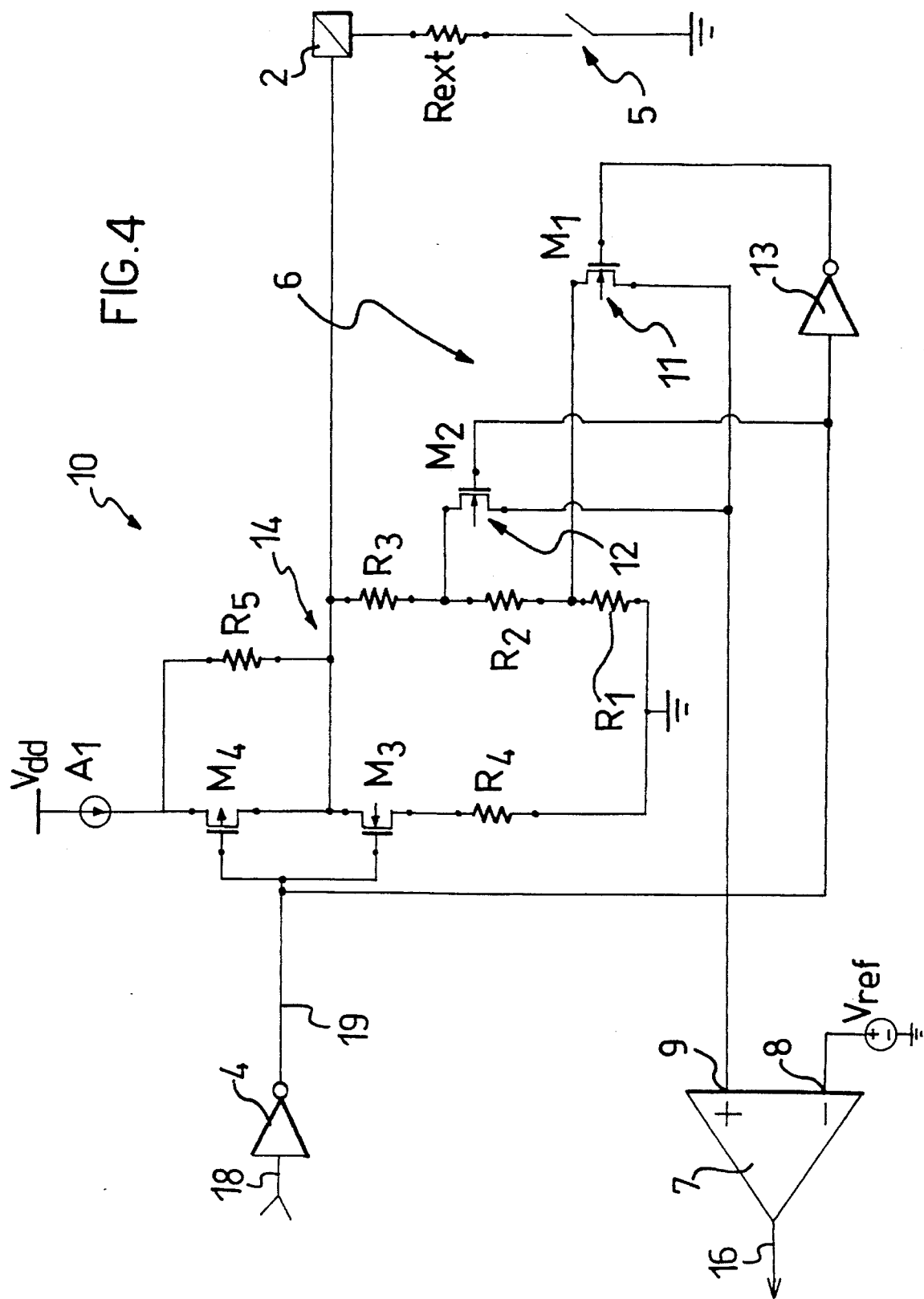
FIG. 4 is a schematic of an embodiment of the circuit in FIG. 3.

The operation of the circuit according to the invention is worth reviewing in the light of the embodiment shown in FIG. 4. Four different conditions of its operation are analyzed below based on the output voltage applied to inverter 4, and whether switch 5 is open or closed.

1) A high output voltage value with resistance $R_{ext}$ unconnected to ground. In this case, transistor M1 would be on and the other transistor M2 is off. The current from source A1 flows through transistor M4 to resistors R3, R2, and R1.

The value of this current is such that the voltage value transferred to input 9 of comparator 7 from transistor M1 is higher than threshold value $V_{ref}$. Thus the comparator output is a logic high. The voltage value at pin 2 is also high consistent with voltage values that are typical of CMOS technology.

2) A high output voltage value with resistance $R_{ext}$ connected to ground. This case is similar to the previous one, except that resistance $R_{ext}$ causes the current flowing through the series of R1, R2, and R3 to decrease. Therefore, the voltage value at the comparator input 9 is inadequate to switch the comparator. Compared to the previous case, the voltage at comparator output terminal 16 is at a logic low and depends on the parallel connection of resistors R1, R2, and R3 and external resistance $R_{ext}$. By appropriate selection of the resistive values, it is possible to keep within the range of CMOS consistency for the digital thresholds.

Pin 2 is at all times held at a logic high equal to $A1*[(R1+R2+R3)//R_{ext}]$; thus, the connection of the external resistance may be said to only have caused a change in the voltage value at the comparator output terminal 16.

3) A low output voltage value with the resistance unconnected to ground. Current from source A1 flows through the resistors R3, R2, and R1, as well as through resistor R5. Transistor M2 is on, while transistor M1 is off.

The voltage at comparator input 9, which is connected to the resistor R2, is higher than the reference threshold $V_{ref}$, and the output of comparator 7 is at a logic high. The voltage value at pin 2 is low, however, and is equal to $A1*[(R1+R2+R3)//R4]$ because of the parallel connection between the series resistors R1, R2 and R3, and resistor R4.

4) A low output voltage value with the resistance connected to ground. Some current from source A1 is redirected toward the external resistance $R_{ext}$ connected to ground. The voltage at input 9 of the comparator 7 is lower than $V_{ref}$, and the voltage at output terminal 16 is at a logic low. The voltage at pin 2 is fixed by the parallel connection of resistor R4, external resistance $R_{ext}$, and the series of R1, R2, and R3. Therefore, the voltage at pin 2 is different from that of case (3) above, but is still at a logic low consistent with the CMOS technology circuits.

When the external resistance is connected to ground, a change occurs in the logic state of the comparator without the logic value at pin 2 being altered. The voltage value present on pin 2 varies slightly according to whether the external resistance is connected, but this variation is tolerable within consistent values of CMOS technologies.

Inasmuch as the connection of the external resistance represents a control signal received on pin 2, it may also be seen that pin 2, although operated as a control input, undergoes no alteration in its logic value when functioning as an output terminal.

Thus, the input voltage from comparator 16 depends on whether switch 5 is open or closed, and does not depend on the output voltage or the voltage on pin 2. The voltage on pin 2 depends on the output voltage and does not depend on switch 5 or on comparator output 16.

The integrated circuit of this invention solves the technical problem and affords a number of advantages, among which is the fact that a single pin can now be used to serve two discrete digital functions that would otherwise require two different control pins if embodied as in the prior art. The two functions using the same pin are wholly independent of each other and retain CMOS consistency for the value of the output logic state. Thus, the digital command on pin 2 is unrelated to the digital output function served by that pin.

Advantageously, the inventive circuit could be applied to the measurement of variations in the output voltage from a digital output, following connection of an external impedance of known value.

Having described an embodiment of the present invention, it should be understood that changes and modifications may be made is the circuit described above without departing from the scope of the invention as defined by the appended claims. For example, the inventive circuit could alternatively be provided with a delay circuit to avoid switching spikes. The comparator 7 could be embodied by a single bipolar npn transistor, and the STANDBY function could be substituted for the digital control MUTE function.

What is claimed is:

1. An integrated circuit comprising:

a first circuit for performing a first function, the first circuit having an input terminal to receive an input signal from an external circuit that is external to the integrated circuit;

a second circuit for performing a second function and for providing a variable output signal, the second circuit having an output terminal to provide the variable output signal to another external circuit that is external to the integrated circuit;

a single pin: and a third circuit for detecting a state of the pin and being coupled to the input terminal, to the single pin, and to the output terminal, so that the input signal to the first circuit and the variable output signal from the second circuit are presentable at the pin simultaneously.

2. The integrated circuit of claim 1, wherein the third circuit includes:

an internal impedance, internal to the third circuit, electrically coupled to the pin; and a comparator having a first terminal coupled to a reference signal, and a second terminal coupled to the internal impedance, the comparator for detecting changes in the signal present on the pin.

3. The integrated circuit of claim 2, further comprising an actuation block having a pair of switches, each one of the pair of switches coupling an opposing end of the internal impedance to the second terminal of the comparator.

4. The integrated circuit of claim 3, wherein the switches include field-effect transistors.

5. The integrated circuit of claim 2, wherein the internal impedance includes a plurality of resistors connected in series.

6. The integrated circuit of claim 5, wherein the set of resistors includes at least three resistors.

7. The integrated circuit of claim 1, further comprising an external switch and an external resistance coupled to the external switch, the external switch and external resistance being coupled to the pin and external to the integrated circuit.

8. A circuit system having a first circuit for performing a first logic function, the first circuit having an input terminal to receive an input signal from an external circuit that is external to the circuit system, a second circuit for performing a second logic function and for providing a variable output signal, the second circuit having an output terminal to provide the variable output signal to another external circuit that is external to the circuit system, the system comprising:

a bidirectional pin;

a third circuit, coupled to the first circuit, the second circuit, and the bidirectional pin, for providing the input signal to the first circuit, and for providing the variable output signal from the second circuit to the bidirectional pin, wherein the variable output signal is detectable at the bidirectional pin at the same time that the input signal is provided to the first circuit.

9. The system of claim 8, wherein the system includes an external switch having a control terminal to receive a third signal, and wherein the input signal is derived from the third signal.

10. The system of claim 9, wherein the external switch includes a gate of a microprocessor.

11. The system of claim 8, wherein the third circuit includes an internal impedance electrically coupled to the pin, the input terminal, and the output terminal.

12. The system of claim 11, further comprising a current source coupled to the internal impedance, and a comparator for detecting a voltage derived from the voltage across the internal impedance.

13. The system of claim 12, further comprising at least one impedance control switch having first and second positions for controlling the internal impedance and causing the voltage derived from the voltage across the internal impedance to change in response to the positions of the impedance control switch.

14. The system of claim 13, wherein the at least one impedance control switch has a control terminal electrically coupled to the output terminal.

15. The system of claim 14, wherein the at least one impedance control switch includes an MOS transistor.

16. The system of claim 13, wherein the comparator has an input terminal coupled to a reference voltage, wherein, if the at least one impedance control switch is in the first position the derived voltage exceeds the reference voltage, and if the at least one impedance control switch is in the second position the derived voltage does not exceed the reference voltage.

17. An apparatus for use with a first circuit having an input terminal for receiving an input signal derived from an external circuit that is external to the apparatus and a second circuit having an output terminal for providing a variable output signal to another external circuit that is external to the apparatus, the apparatus comprising;

a single terminal pin;

a switch coupled to the terminal pin, the switch having a control terminal;

a third circuit coupled to the pin for providing the input signal to the first circuit in response to a control signal at the control terminal of the switch, and for providing the variable output signal at the pin at the same time that the input signal is provided to the first circuit.

18. An apparatus for use with a first circuit having an input terminal for receiving an input signal derived from an external circuit that is external to the apparatus and a second circuit having an output terminal for providing an output signal to another external circuit that is external to the apparatus, the apparatus comprising;

a single terminal pin;

a switch coupled to the terminal pin, the switch having a control terminal;

a third circuit coupled to the pin for providing the input signal to the first circuit in response to a control signal at the control terminal of the switch, and for providing the output signal at the pin at the same time that the input signal is provided to the first circuit, wherein the third circuit includes a current source and a controllable impedance coupled to the terminal pin, wherein the impedance is controlled at least partly in response to the control signal and at least partly in response to the output signal.

19. The apparatus of claim 18, wherein the third circuit further includes a plurality of electrical switches, at least one of which is coupled to the output terminal.

20. A method for using an integrated circuit having a first circuit for receiving an input signal at an input terminal from an external circuit that is external to the integrated circuit through a pin, and having a second circuit for providing a variable output signal at an output terminal to another external circuit that is external to the integrated circuit through said pin, and wherein the pin is coupled to an external switch having a control terminal, the method comprising the steps of:

providing the variable output signal to the pin;

applying a control signal to the control terminal of the external switch; and providing the input signal to the first circuit based upon the control signal and the variable output signal.

21. In a digital circuit system having a first circuit for providing a variable output signal that has a first voltage level and a second voltage level at an output terminal through a terminal pin to an external circuit that is external to the circuit system, and having a second circuit for receiving an input signal that has the first voltage level and the second voltage level at an input terminal through said terminal pin from another external circuit that is external to the circuit system, an apparatus comprising:

a switch electrically coupled to the terminal pin and to a reference voltage; and a third circuit coupled to the terminal pin, the input terminal, and the output terminal, the third circuit for receiving the variable output signal from the first circuit and for providing the input signal to the second circuit, wherein the third circuit provides one of the first voltage level and the second voltage level to the second circuit in response to the switch, and wherein the third circuit provides an output voltage level to the terminal pin that corresponds to the voltage level at the output terminal in response to the voltage level at the output terminal.

22. The apparatus of claim 21, wherein the first voltage level is a range of high digital voltage levels, and wherein the second voltage is a range of low digital voltage levels.

23. A circuit for use with a first circuit having an output terminal for providing a variable output signal at an output terminal through a single terminal pin to an external circuit that is external to the circuit and a second circuit for receiving an input signal at an input terminal from another external circuit that is external to the circuit through said signal terminal pin, the circuit comprising:

a controllable impedance coupled to the input terminal and the output terminal;

at least one electrical switch coupled to the impedance and to the output terminal;

said single terminal pin coupled to the controllable impedance;

a resistance that is external to the circuit coupled to the terminal pin; and a switch coupled in series to the resistance, the switch and the resistance being coupled in series between the terminal pin and a reference voltage.

24. The circuit of claim 23, further comprising a current source for providing a current to the impedance and the resistance, and a voltage detector for detecting a voltage derived from the current flowing through the impedance.

25. The circuit of claim 24, wherein the detector is a comparator.

26. The circuit of claim 24 wherein the derived voltage varies depending on whether the electrical switch and the switch coupled in series to the resistance are open or closed.

27. The circuit of claim 23, further comprising:

a current source for providing a current to the impedance, and a comparator for detecting a voltage derived from the current flowing through the impedance, the comparator being coupled to a reference voltage, wherein there are a plurality of electrical switches, at least some of which are coupled to the output terminal, wherein the voltage derived from the current flowing through the impedance is responsive to whether the electrical switches and the switch coupled in series with the resistance are open or closed, wherein the first and second circuits are digital circuits for providing and receiving, respectively, voltages within a high range and a low range corresponding to first and second bit values;

wherein, when the switch coupled in series with the resistance is closed, the detected derived voltage is greater than the reference voltage so that the comparator provides a voltage within the high range;

wherein, when the switch coupled in series with the resistance is open, the detected derived voltage is less than the reference voltage so that the comparator provides a voltage within the low range;

wherein, when the variable output signal has a voltage in the high range, the terminal pin has a voltage in the high range; and wherein, when the variable output signal has a voltage in the low range, the terminal pin has a voltage in the low range.

* * * * *